(12) United States Patent
Chuang

(10) Patent No.: US 7,781,940 B1
(45) Date of Patent: Aug. 24, 2010

(54) PIEZOELECTRIC TACTILE SENSOR

(75) Inventor: Cheng Hsin Chuang, Tainan (TW)

(73) Assignee: Southern Taiwan University, Yung Kang (TW)

( * ) Notice: Subject to any disclaimer, the term of this patent is extended or adjusted under 35 U.S.C. 154(b) by 0 days.

(21) Appl. No.: 12/379,127

(22) Filed: Feb. 13, 2009

(51) Int. Cl.
*H01L 41/113* (2006.01)
*H01L 41/18* (2006.01)
*G01L 1/00* (2006.01)

(52) U.S. Cl. .......................... 310/338; 310/800; 73/774

(58) Field of Classification Search ................. 310/338, 310/339, 800; 73/774
See application file for complete search history.

(56) References Cited

U.S. PATENT DOCUMENTS

| | | | | |
|---|---|---|---|---|
| 4,409,548 A | * | 10/1983 | Focht | ......................... 324/168 |
| 5,389,850 A | * | 2/1995 | Wilmer | ....................... 310/329 |
| 5,811,910 A | * | 9/1998 | Cameron et al. | ............. 310/324 |
| 7,661,319 B2 | * | 2/2010 | Liu et al. | ....................... 73/774 |

\* cited by examiner

*Primary Examiner*—Thomas M Dougherty
(74) *Attorney, Agent, or Firm*—Bacon & Thomas, PLLC

(57) ABSTRACT

A novel flexible tactile sensor for sensing the force direction was designed by introducing the concept of structural electrodes on a piezoelectric film. The structural electrodes comprised an elastomeric column and distributed microelectrodes between the column and piezoelectric film. As a periodic small force acts at the elastomeric column, the force is transferred to the piezoelectric film based on the column bending behavior therefore the scale of force can be detected by the output voltages from the distributed electrodes due to the corresponding force state under the column. In addition, two opposite output signals from different sides of the column can differentiate the force direction as the column is bent by external force. The resulting signal for sensing force and its direction depends on the size of column.

3 Claims, 7 Drawing Sheets

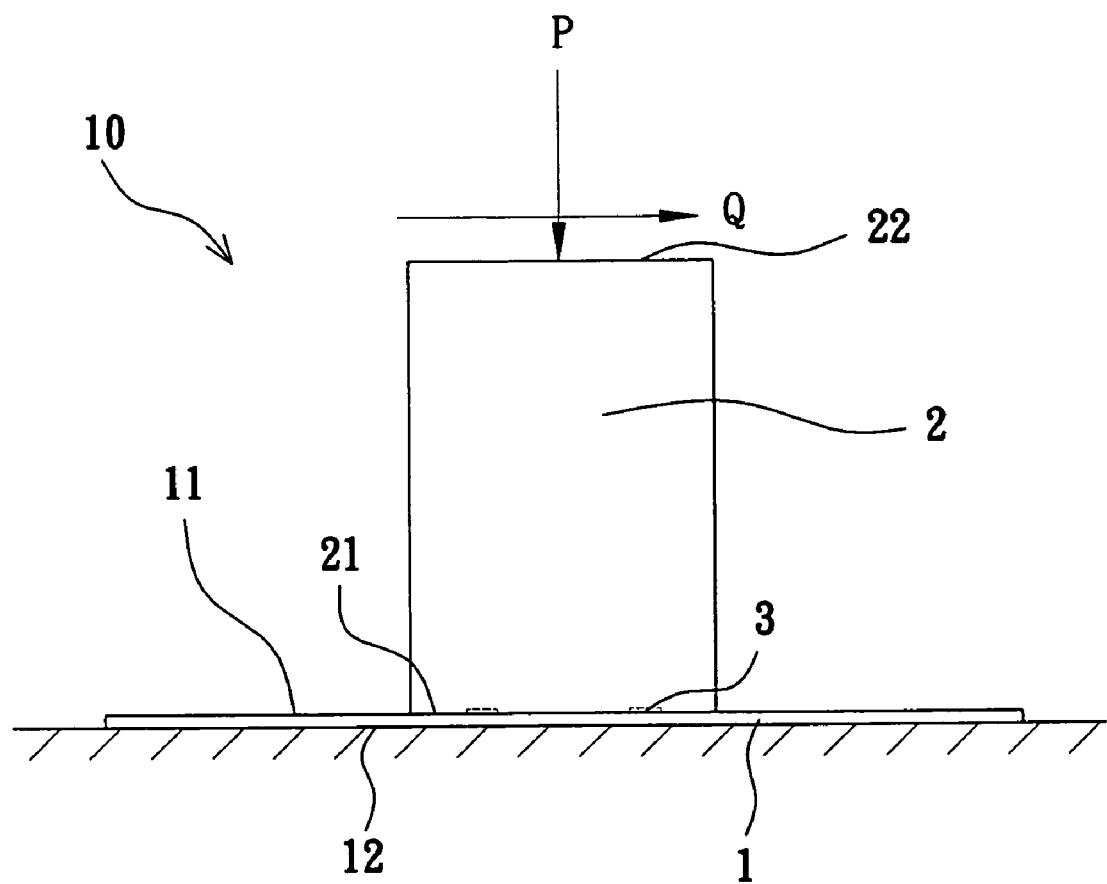
F I G. 2

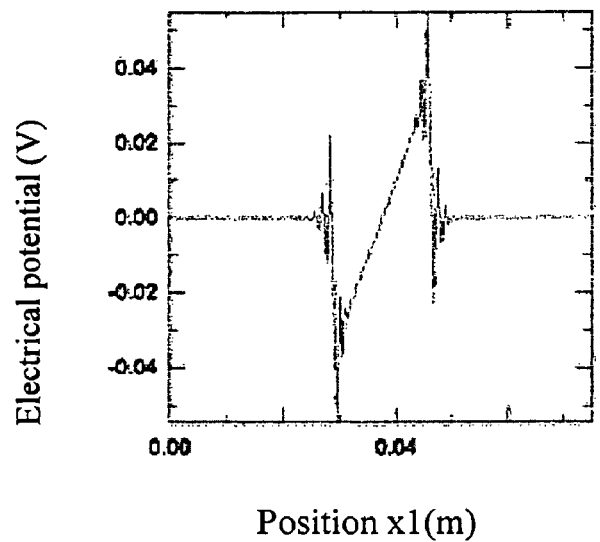
F I G. 4
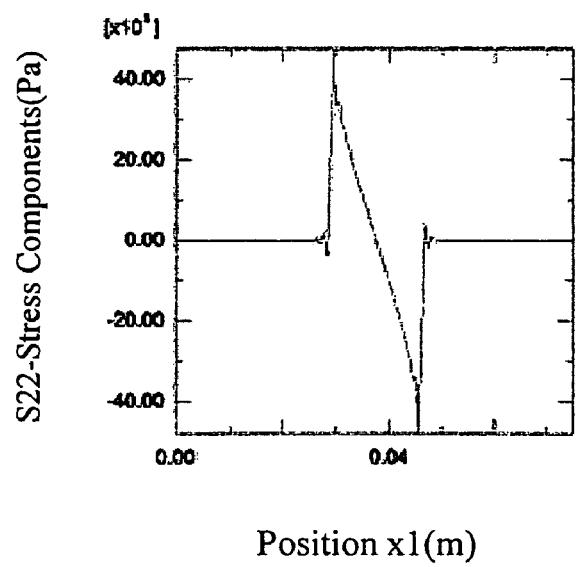
F I G. 5

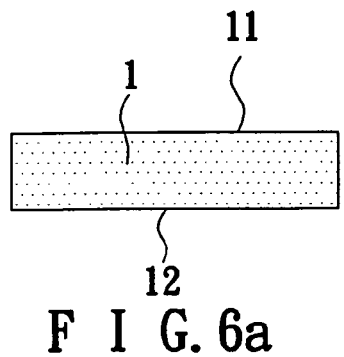
F I G. 6a
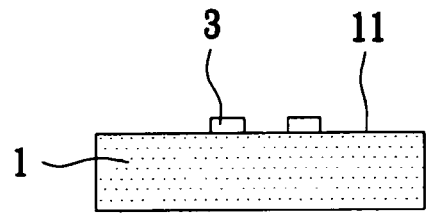
F I G. 6e
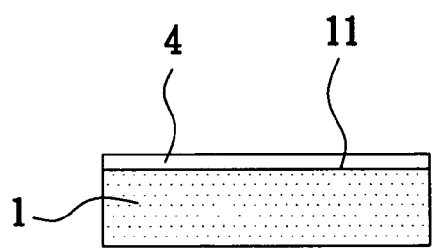
F I G. 6b
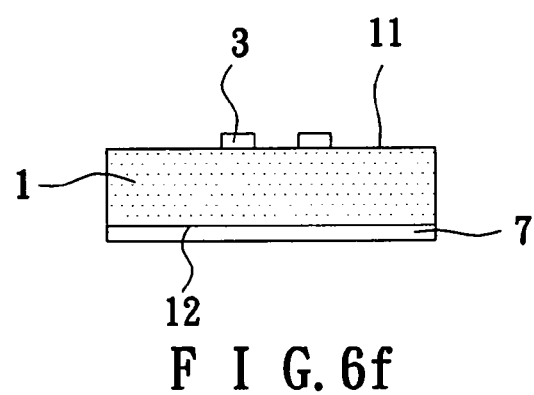
F I G. 6f
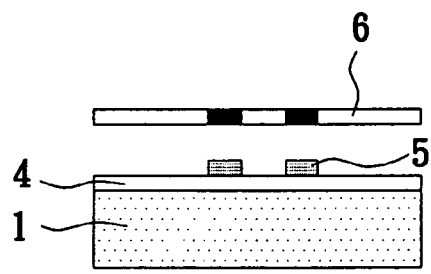
F I G. 6c
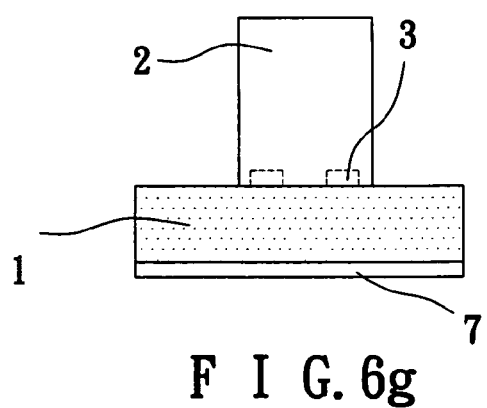
F I G. 6g
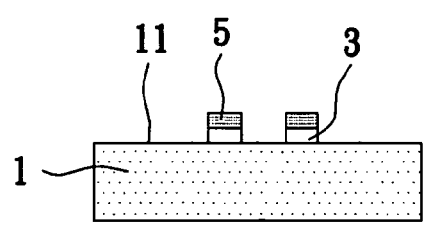
F I G. 6d

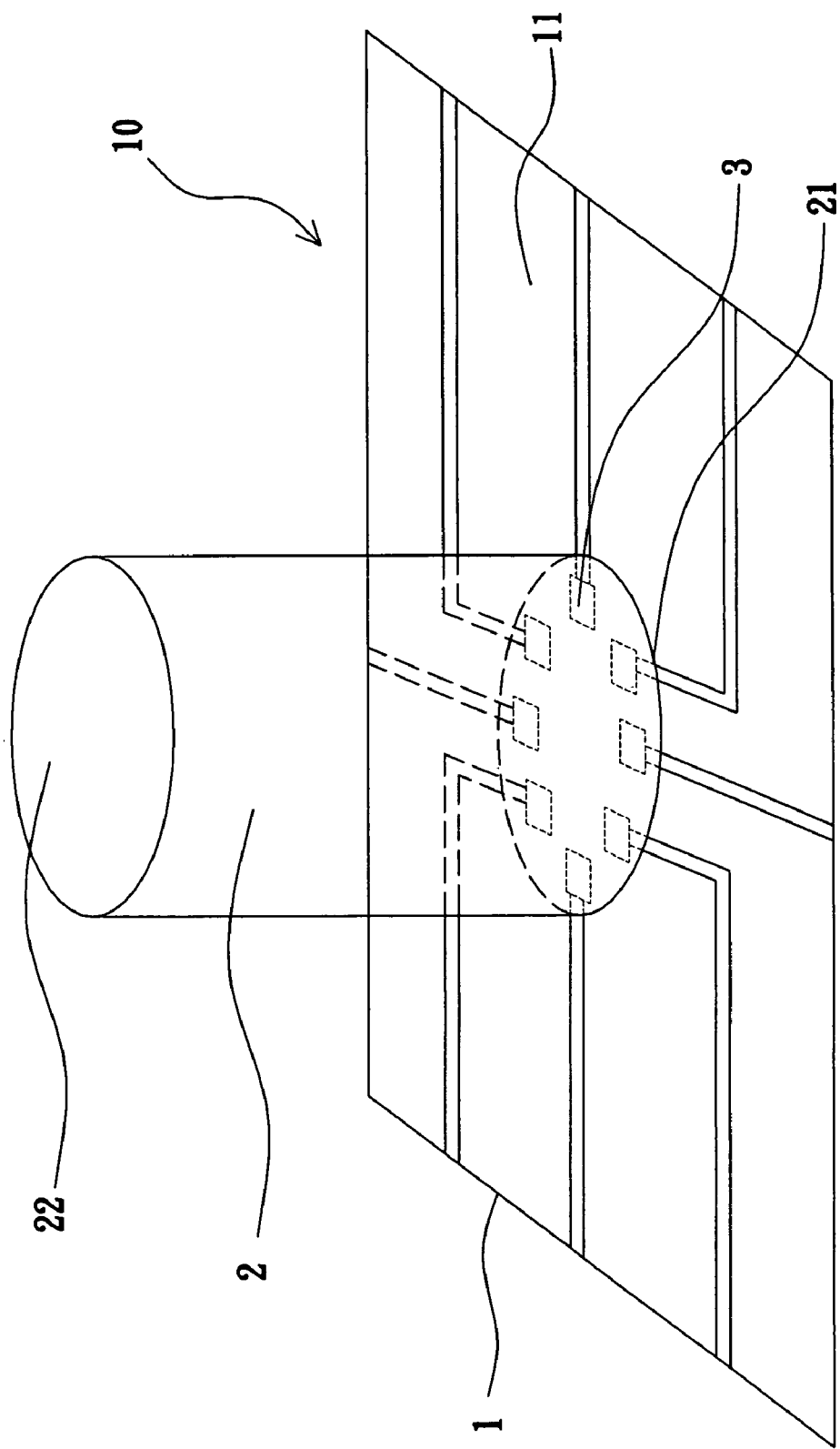
F I G. 7

PIEZOELECTRIC TACTILE SENSOR

TECHNICAL FIELD OF THE INVENTION

The present invention provides a piezoelectric tactile sensor, particularly for one that features in discerning multi-axial force, and also offers a fabricating method thereof.

PRIOR ARTS OF THE INVENTION

The popular application of the tactile sensor includes robot field, information industry, industrial automation, biomedical devices, wired/wireless physiological monitors, joysticks or control levers of the videogames and the like. Most of conventional tactile sensors belong to the tactile sensors in measurement of normal force. For tactile sensors in measurement of lateral shear force or multi-axial force are few.

Wherein, regarding the tactile sensors about application of lateral shear force, U.S. Pat. No. 5,871,248 discloses a "Robot gripper", which comprises a pair of gripper surfaces with flexible, non-elastic films disposed on each gripper surface respectively, these films being comprised of cubic cells filled with compressible fluid, so that when each gripper surface makes contact with the object to be lifted, they simultaneously compress and lift the object whereby the friction between the object and the gripper surfaces generates a shear force which distorts the films. As the compression and lifting forces are simultaneously increased, the distortion to the films will also increase until the pressure inside the cubic cells is large enough to provide sufficient friction force to lift the object. Therefore, it is not required to know the weight of the object to be gripped beforehand.

U.S. Pat. No. 4,745,812 discloses a "Tri-axial tactile sensor", which comprises an array of unique micro-machined bossed silicon elastomeric column cells in conjunction with requisite electrical circuitry and components, which collectively provide ability to sense torque by detecting both normal and lateral applied loads. Electrical signal information from sensor-incorporated internal and external related circuitry components can be analyzed via computer devices to yield specific loading characteristics on the sensor surface. The related circuitry is fabricated by diffusing piezoresistive areas and thin film conducting strips and tap-off points. These areas and related conductive circuitry for each of the micro-small sensor elements are configurable as two Wheatstone bridges which thereby help provide for the measurement of both normal and lateral load component magnitudes Besides, some of conventional tactile sensors employ strain gauge, ultrasonic elastomeric column, or piezoelectric-resistor to sense the multi-axial force.

SUMMARY OF THE INVENTION

Having realized the popular application of the tactile sensor for discerning the multi-axial force and the urgent need about different designs and technologies in the tactile sensor as options for the publics, the inventor of the present invention successfully worked out the piezoelectric tactile sensor of the present invention after painstaking study and development with utmost attention. Accordingly, the primary object of the present invention is to provide a piezoelectric tactile sensor with features of simple structure and inference about the bending moment of the external force subjected via induced voltage signal so that the sensor can be employed to figure out the direction and magnitude of the external multi-axial force subjected when it is used in the touch-controlled devices, the anti-slip sensor in the gripper of the robot and the like.

The piezoelectric tactile sensor of the present invention comprises a piezoelectric film, a elastomeric column and distributed microelectrodes, wherein said piezoelectric film includes a top surface and a corresponding opposite bottom surface; said elastomeric column, which is an elastic column, includes a top end surface and a bottom end surface, which overlays over the top surface of the piezoelectric film; said microelectrodes are sandwiched between the top surface of the piezoelectric film and the bottom end surface of the elastomeric column in spread manner; and said piezoelectric film will generate uneven force distribution to initiate said distributed microelectrodes output a corresponding induced voltage signal upon said elastomeric column being subjected to an external force.

In an exemplary preferred embodiment, said piezoelectric film is made of polyvinylidene fluoride (PVDF) polymer and said elastomeric column is made of silicon rubber.

In the other exemplary preferred embodiment, said piezoelectric tactile sensors can be expanded into array pattern for better sensing the profile of the target object.

The present invention also discloses a fabricating method of piezoelectric tactile sensor comprises processing steps as below:

a. Prepare a piezoelectric film with a top surface and a bottom surface;

b. Form a metallic layer on the top surface of the piezoelectric film;

c. Etch the metallic layer to obtain a distributed microelectrode configuration on the top surface of the piezoelectric film; and d. Overlay the bottom end surface of the elastic elastomeric column over the top surface of the piezoelectric film such that the distributed microelectrodes are sandwiched between the bottom end surface of the elastic elastomeric column and the top surface of the piezoelectric film.

In an exemplary preferred embodiment, a processing step is intervened between the previous steps of b and c that coating over the metallic layer by a layer of photoresist with a photomask pattern thereon to develop the pattern.

Regarding the other objects, advantages and features of the present invention, following exemplary preferred embodiments are described in detailed manner with associated drawings for your better under understanding and perusal.

DETAILED DESCRIPTION OF THE PREFERRED EMBODIMENTS

Regarding the structure for the piezoelectric tactile sensor of the present invention, a detailed disclosure for an exemplary preferred embodiment, which is not intended for confining the scope of the present invention, is further described below in reference to associated drawings. FIGS. 1 and 2 shows a piezoelectric tactile sensor 10 of the present invention is subjected to a normal force and a shear force (also simply known as shear) as an exemplary preferred embodiment of the present invention. The piezoelectric tactile sensor 10 comprises a piezoelectric film 1, a elastomeric column 2 and distributed microelectrodes 3, wherein said piezoelectric film 1, which is made of polyvinylidene fluoride (PVDF) polymer with properties of lightweight, high piezoelectric force coefficient, good flexibility and high strength in mechanical properties, includes a top surface 11 and a corresponding opposite bottom surface 12 with wires for connecting to related signal (not shown); said elastomeric column 2, which is an elastic column made of silicon rubber, includes a top end surface 22 and a bottom end surface 21, which overlays over the top surface 11 of the piezoelectric film 1; and said microelectrodes 3 are sandwiched between the top surface 11 of the piezoelectric film 1 and the bottom end surface 21 of the elastomeric column 2 in spread manner.

FIGS. 3a and 3b shows the characteristics of the force distribution for the piezoelectric tactile sensor 10 being subjected to a multi-axial force, where P denotes a normal force while Q denotes a horizontal shear force as shown in the FIG. 2. According to basic theory in the mechanics of materials, the resultant effect of the normal force P and shear force Q can be analyzed as below:

Let the shear force Q is constant and normal force P is variable.

If the magnitude of the normal force P is less than the bending moment of the shear force Q, then the resultant force distribution will be shown as the FIG. 3b such that the strain area of the piezoelectric film 1 acted by the elastomeric column 2 is divided into compression zone (also called compressive force zone) and tension zone (also called tensional force zone) with deviated neutral axis due to unbalanced resultant force.

If the magnitude of the normal force P is increased to be greater than the bending moment of the shear force Q, then the resultant force distribution will be shown as the FIG. 3a such that the strain area of the piezoelectric film 1 acted by the elastomeric column 2 is entirely affected into compression zone with different magnitudes of compressive force at both ends thereof due to uneven resultant compressive force.

If ($\sigma_L$) denotes the magnitudes of compressive force at left end of the strain area of the piezoelectric film 1 while ($\sigma_R$) denotes the magnitudes of compressive force at right end of the strain area of the piezoelectric film 1, then the magnitude of resultant compressive/tensional force subjected by the bending moment of the shear force Q is $$\left(\frac{\sigma_R + \sigma_L}{2}\right)$$

while the magnitude of resultant evenly distributed compressive force is $$\left(\frac{\sigma_R - \sigma_L}{2}\right).$$

Thus, when the elastomeric column 2 is subjected to the multi-axial force, no matter what the magnitude of the normal force P, a set of different left force component magnitude ($\sigma_L$) and right force component magnitude ($\sigma_R$) will happen in both affected ends at the bottom end surface 21 of the elastomeric column 2 so that both ends at the strain area of the abutted piezoelectric film 1 will be acted to induce different magnitudes of the left induced voltage component $V_L$ and right induced voltage component $V_R$.

Generally, if the piezoelectric film 1 is virtually subjected to resultant force along the direction of thickness (i.e. orthogonal to the surface thereof) without any friction, and the plane in longitudinal and transverse directions is hypothetically infinite, the induced voltage can be derived from the formula of ($V_0 = g_{22}\sigma_2 t$).

Where, ($V_0$) is the induced open-circuit output voltage of the piezoelectric film 1; ($g_{22}$) is the piezoelectric force coefficient thereof; ($\sigma_2$) is the resultant force along the thickness direction thereof; and (t) is the thickness thereof. Basing on the ($V_0 = g_{22}\sigma_2 t$) aforesaid, the induces voltage ($V_0$) is direct proportional to the resultant force along the thickness direction ($\sigma_2$) since the piezoelectric force coefficient ($g_{22}$) and thickness (t) are constant virtually in the exemplary embodiment. When the piezoelectric film 1 is subjected to multi-axial force, the induced voltage ($V_0$) at the left end, which is denoted as ($V_L$), and the induced voltage ($V_0$) at the right end, which is denoted as ($V_R$), will be different since the resultant force ($\sigma_2$) acting on the left end, which is denoted as ($\sigma_L$) is different to the resultant force ($\sigma_2$) acting on the right end, which is denoted as ($\sigma_R$). For example, in the case of the FIG. 3b, the (VL) is positive value while the (VR) is negative value; whereas in the case of the FIG. 3a, both of (VL) and (VR) are all negative values but different in the magnitudes owing to the magnitude difference between the left resultant force ($\sigma_L$) and the right resultant force ($\sigma_R$). Thus, with ($V_L$) and ($V_R$), the external multi-axial force can be figured out by reverse inference.

Thereby, in the practical embodiment for the piezoelectric tactile sensor 10 of the present invention, if the elastomeric column 2 is subjected to an external multi-axial force, the piezoelectric film 1 will generate different magnitudes of induced voltages ($V_L$) and ($V_L$), both of which are caused by the different resultant forces ($\sigma_L$) and ($\sigma_R$) in uneven force distribution. Thus, the different induced voltages ($V_L$) and ($V_L$) can be captured by the piezoelectric film 1 to be converted into interpretable information to analyze the direction and magnitude of the multi-axial force subjected.

Please refer to the FIGS. 4 and 5, which show the trend characteristics graphs respectively about the induced voltage distribution and force distribution for the elastomeric column 2 of the piezoelectric film 1 by an modeling simulation of the Finite Element Analysis (FEA) method, wherein the elastomeric column 2 is subjected to a horizontal shear force.

In the exemplary simulated embodiment, the element form of the piezoelectric film 1 is piezoelectric type while the element shape thereof is hexahedron with 20 nodes, and the thickness thereof is 52 μm with a grounding terminal fixed, whereas the elastomeric column 2, which dimensions in 30 mm height by 17 mm width, is subjected to an external shear force in magnitude of 1 Newton near the top thereof.

The FIG. 4 shows the variation characteristics of the induced voltage ($V_0$) captured from a suitable path on the (piezoelectric film 1) that the induced voltage ($V_R$) in the compression zone (also known as compressive force zone) is positive value while the induced voltage ($V_L$) in the tension zone (also known as tensional force zone) is negative value.

Similarly, the FIG. 5 shows the variation characteristics of the resultant force ($\sigma_2$) captured from a suitable path on the piezoelectric film 1 that the resultant force ($\sigma_R$) in the compression zone (also known as compressive force zone) is negative value while the resultant force ($\sigma_L$) in the tension zone (also known as tensional force zone) is positive value.

With information reflects above, the direction of the external multi-axial force acting on the elastomeric column 2 can be ascertained is from left to right.

Thus, by means of the left induced voltage ($V_L$) and the right induced voltage ($V_R$) from the piezoelectric film 1, the direction and magnitude of the external multi-axial force can be figured out via interpretable analysis.

Refer to the FIGS. 6a through 6g. The processing steps for the fabricating method of the piezoelectric tactile sensor provided by the present invention are described as below:

a. Prepare a piezoelectric film 1 with a top surface 11 and a bottom surface 12 (as shown in the FIG. 6a);

b. Form a metallic layer 4 on the top surface 11 of the piezoelectric film 1 (as shown in the FIG. 6b), which can be accomplished by depositing a layer of chromium (Cr) alloy or mixture thereon via E-beam Evaporator in an exemplary embodiment;

c. Coat over the metallic layer 4 by a layer of photoresist 5 with a photomask 6 pattern thereon to develop the pattern (as shown in the FIG. 6c);

d. Etch the metallic layer 4 via the pattern formed (as shown in the FIG. 6d);

e. Remove the residues of the photoresist 5 to obtain the distributed microelectrodes 3 configuration on the top surface 11 of the piezoelectric film 1 (as shown in the FIG. 6e);

f. Form a metallic film 7 beneath the bottom surface 12 of the piezoelectric film 1 (as shown in the FIG. 6f), which can be accomplished by E-beam Evaporator to have metallic film 7 as grounding electrode; and g. Overlay the bottom end surface 21 of the elastic elastomeric column 2 over the top surface 11 of the piezoelectric film 1 such that the distributed microelectrodes 3 are sandwiched between the bottom end surface 21 of the elastic elastomeric column 2 and the top surface 11 of the piezoelectric film 1 (as shown in the FIG. 6g).

The piezoelectric tactile sensor 10 of the present invention is a pioneer in employing the piezoelectric film 1 and distributed microelectrode 3 to capture the force distribution from the elastomeric column 2. Namely, when the piezoelectric tactile sensor 10 is subjected to the multi-axial force, the elastic elastomeric column 2 is strained to create uneven force zones of compression zone and tension zone on the piezoelectric film 1 so that corresponding positive and negative induced voltages ($V_0$) are generated by the distributed microelectrodes 3. By means of the induced voltages ($V_0$) obtained, the bending moment due to external multi-axial force can be figured out retroactively. And then, the direction and magnitude of the multi-axial force can be calculated accordingly.

FIG. 7 shows the other exemplary preferred embodiment for the piezoelectric tactile sensor 10 of the present invention, wherein the distributed microelectrodes 3 of the piezoelectric tactile sensor 10 are sandwiched into ring arrangement between the top surface 11 of the piezoelectric film 1 and the bottom end surface 21 of the elastomeric column 2, wherein the elastomeric column 2, when being subjected to the external multi-axial force, can generate induced voltage ($V_0$) of high resolution for being analyzed to figure out the direction and magnitude of the external multi-axial force.

Moreover, the arrangement of the piezoelectric tactile sensor 10 can be expanded into array pattern for better sensing the profile of the target object as shown in the FIG. 8. The distributed elastomeric columns 2 overlay over the top surface 11 of the piezoelectric film 1 in array manner and the distributed microelectrodes 3 of each elastomeric columns 2 are sandwiched between the top surface 11 of the piezoelectric film 1 and the bottom end surface 21 of the elastomeric column 2 in separated manner, wherein the cluster of the elastomeric columns 2, when being subjected to the external multi-axial force, can generate group induced voltages ($V_0$) of high resolution for being analyzed to figure out the slip, movement, position, displacement, contacting area, shape of the sensing object as well as the direction and magnitude of the external multi-axial force.

Besides, both of the structure and fabricating process disclosed heretofore are very simple without need of extra power supply that results in having achieved the expected objects and application effects.

Moreover, the applicable realm for the piezoelectric tactile sensor 10 of the present invention covers:

1. Robot Field: Movement control of the robot such as gripping object, interface between man and the machined pet such as machined dog pet AIBO™ from SONY.

2. Information Industry: Touch input device in combination of display device such as touch screen on the Personal Digital Assistant (PDA), fingerprint identification, Virtual Reality and the like.

3. Industrial Automation: Measuring and inspecting devices for the instrument calibration and product design such as tire texture pattern and force distribution on the touching ground for design of the tire grapping force against the ground.

4. Biomedical Devices: Typical application in popular smart skin, assistant devices for diagnosing the breast tumor or prostate gland disease.

5. Physiological Monitors: Various wired/wireless physiological devices for monitoring the respiration, heartbeat and pulsation in either wristlet, or sticking plaster or disposable types.

The disclosure heretofore is the description about the structure of the present invention as the exemplary preferred embodiments. However, the embodiments can be changed and modified in many ways in accordance with the nature and spirit of the present invention. Therefore, any equivalent substitution and alteration, which can be easily done by people who are skillful in this technical field in the manner of not departing from the nature and spirit of the present invention, should be reckoned as in the claim scope and range of the present invention.

BRIEF DESCRIPTION OF THE DRAWINGS

FIG. 2 is the cross sectional schematic view of the previous FIG. 1 to show the piezoelectric tactile sensor is subjected to a normal force and a shear force.

FIGS. 4 and 5 are the trend characteristics graphs respectively showing the induced voltage distribution and force distribution of the piezoelectric tactile sensor being subjected to a horizontal shear force of 1 Newton force as an exemplary preferred embodiment of the present invention.

FIGS. 6a through 6g are the flow charts showing the fabrication process for the piezoelectric tactile sensor of the present invention as an exemplary preferred embodiment of the present invention.

FIG. 7 is the perspective schematic view showing the other exemplary preferred embodiment for the piezoelectric tactile sensor of the present invention.

Figure 1:
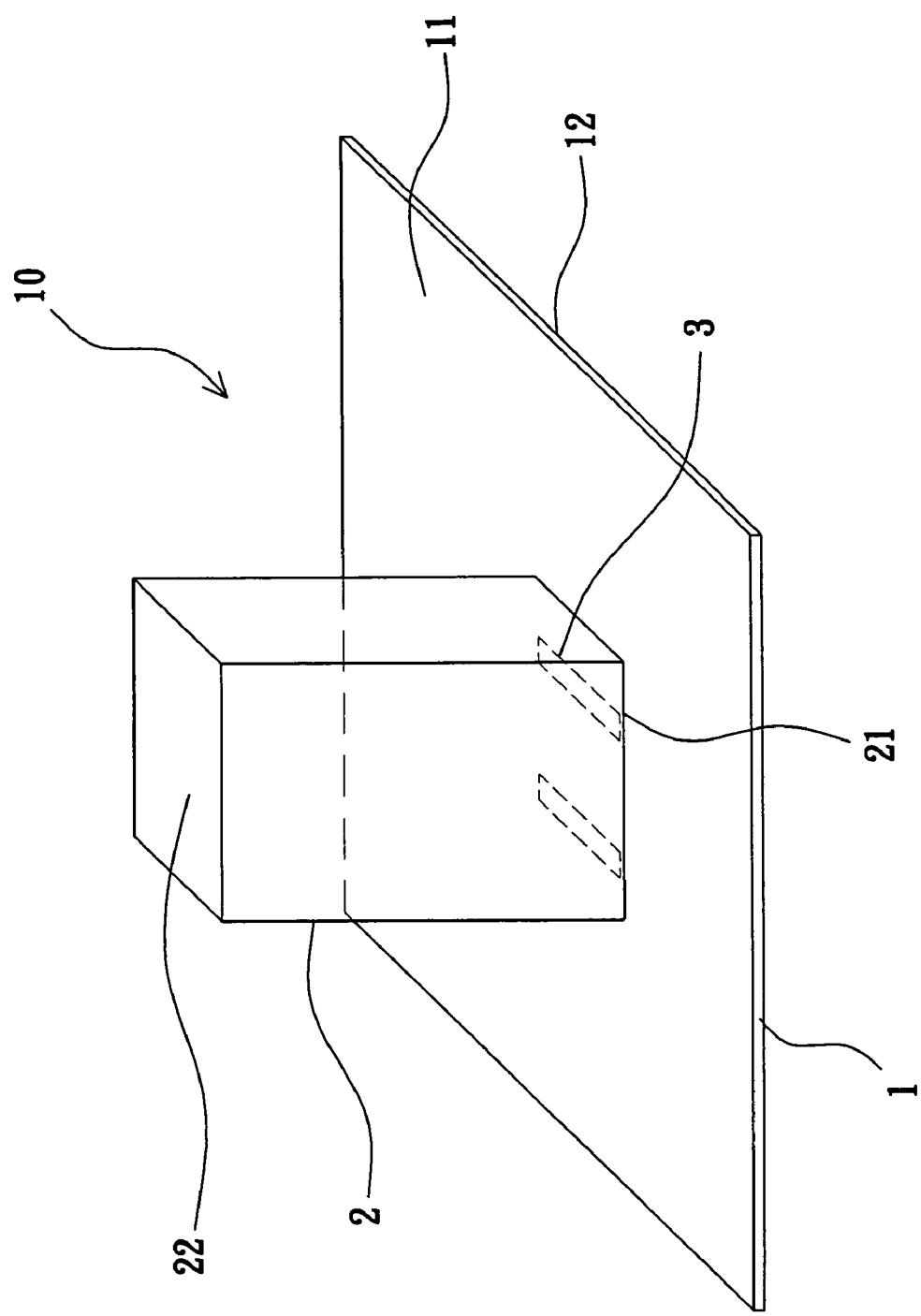
FIG. 1 is the perspective schematic view showing an exemplary preferred embodiment for the piezoelectric tactile sensor of the present invention.
Figure 3A:
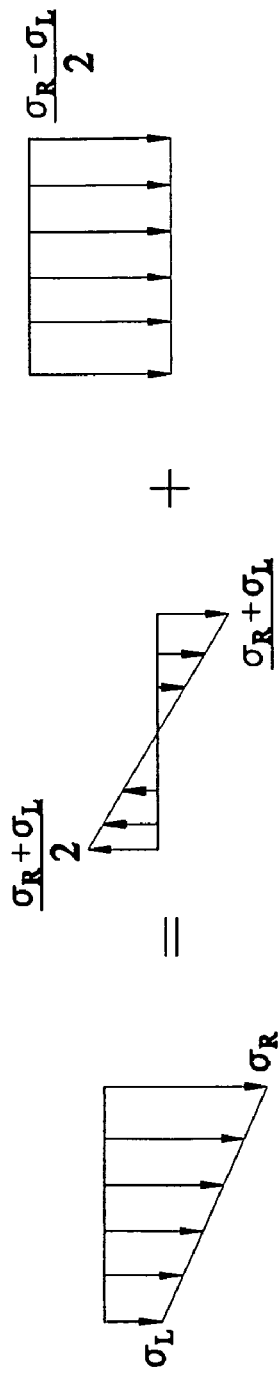
FIGS. 3a and 3b are the schematic views of the previous FIG. 2 to show the characteristics of the force distribution for the piezoelectric tactile sensor being subjected to a normal force and a shear force.
Figure 3B:
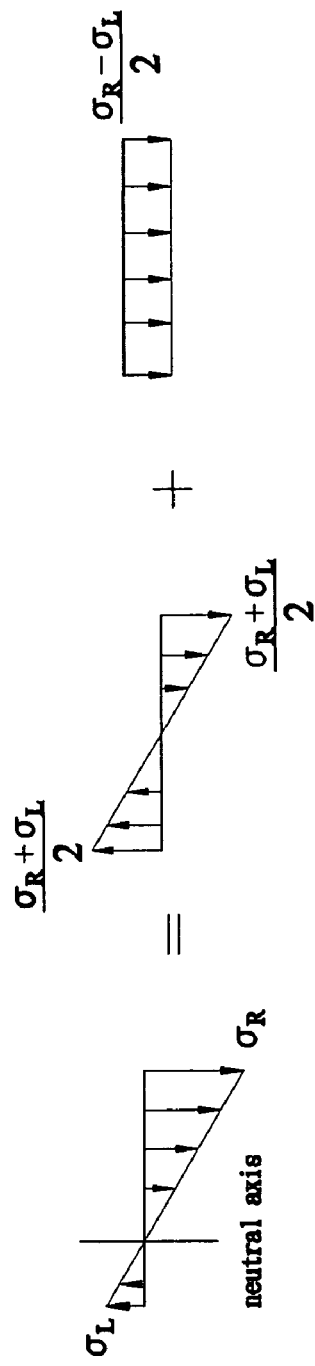
Figure 8:
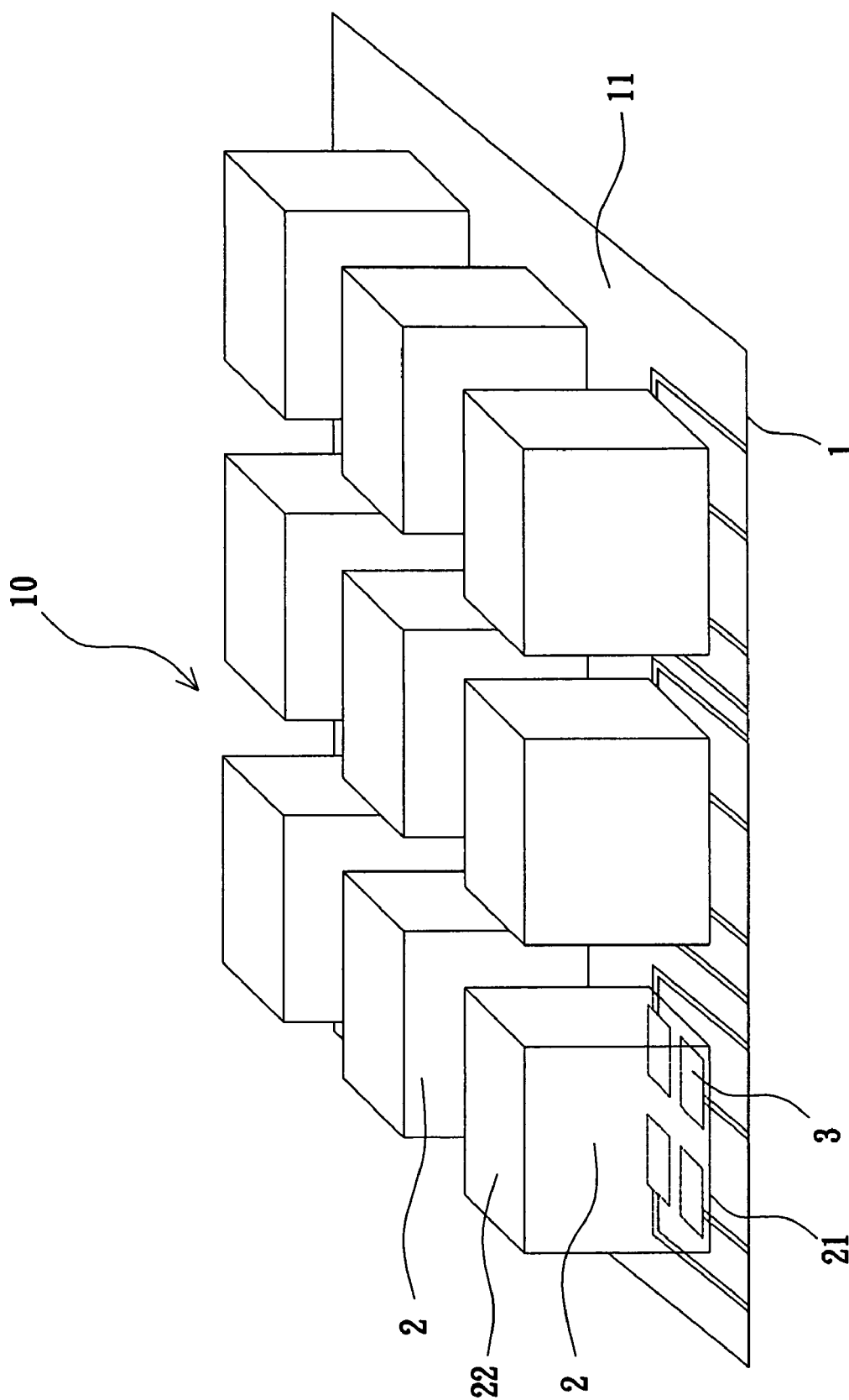
FIG. 8 is the perspective schematic view showing an array for the piezoelectric tactile sensor arrangement of the present invention.

What is claimed is:

1. A piezoelectric tactile sensor comprises a piezoelectric film, a elastomeric column and distributed microelectrodes, wherein said piezoelectric film includes a top surface and a corresponding opposite bottom surface; said elastomeric column, which is an elastic column, includes a top end surface and a bottom end surface, which overlays over the top surface of the piezoelectric film; said microelectrodes are sandwiched between the top surface of the piezoelectric film and the bottom end surface of the elastomeric column in spread manner; and said piezoelectric film will generate uneven force distribution to initiate said distributed microelectrodes output a corresponding induced voltage signal upon said elastomeric column being subjected to an external force.

2. The piezoelectric tactile sensor is recited and claimed in the claim 1, wherein said piezoelectric film is made of polyvinylidene fluoride (PVDF) polymer, said elastomeric column is made of silicon rubber, and said microelectrodes are sandwiched between the top surface of the piezoelectric film and the bottom end surface of the elastomeric column in manner of ring arrangement.

3. The piezoelectric tactile sensor is recited and claimed in the claim 2, wherein distributed elastomeric columns of silicon rubber are further included to overlay over the top surface of the piezoelectric film in array manner and the plural distributed microelectrodes of each elastomeric columns are sandwiched between the top surface of the piezoelectric film and the bottom end surface of the elastomeric column in separated manner.

* * * * *